US009613680B2

(12) United States Patent
Cho

(10) Patent No.: US 9,613,680 B2
(45) Date of Patent: Apr. 4, 2017

(54) SEMICONDUCTOR DEVICE WITH IMPROVED SENSE MARGIN OF SENSE AMPLIFIER

(71) Applicant: SK hynix Inc., Icheon-si, Gyeonggi-do (KR)

(72) Inventor: Jin Hee Cho, Cheongju-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/937,141

(22) Filed: Nov. 10, 2015

(65) Prior Publication Data

US 2017/0053692 A1    Feb. 23, 2017

(30) Foreign Application Priority Data

Aug. 21, 2015    (KR) ........................ 10-2015-0117926

(51) Int. Cl.
| | |
|---|---|
| G11C 7/22 | (2006.01) |
| G11C 11/4091 | (2006.01) |
| G11C 5/06 | (2006.01) |
| G11C 11/4096 | (2006.01) |
| G11C 11/408 | (2006.01) |

(52) U.S. Cl.
CPC .......... *G11C 11/4091* (2013.01); *G11C 5/063* (2013.01); *G11C 11/4087* (2013.01); *G11C 11/4096* (2013.01)

(58) Field of Classification Search
None
See application file for complete search history.

(56) References Cited

U.S. PATENT DOCUMENTS

| 6,023,428 | A  | * | 2/2000 | Tran ..................... | G11C 7/1075 365/189.04 |
|---|---|---|---|---|---|
| 7,474,550 | B2 |   | 1/2009 | Fujisawa et al. | |
| 2005/0141333 | A1 | * | 6/2005 | Fujisawa ............. | G11C 7/1066 365/233.1 |
| 2008/0013376 | A1 | * | 1/2008 | Sim ..................... | G06F 17/5072 365/185.13 |
| 2010/0165693 | A1 | * | 7/2010 | Ohgami ................ | G11C 5/025 365/51 |
| 2011/0176379 | A1 | * | 7/2011 | Takayama .......... | G11C 11/4091 365/208 |

FOREIGN PATENT DOCUMENTS

KR    1020080006945 A    1/2008

* cited by examiner

*Primary Examiner* — Son Dinh
*Assistant Examiner* — Sultana Begum
(74) *Attorney, Agent, or Firm* — William Park & Associates Ltd.

(57) ABSTRACT

Semiconductor devices capable of a sensing margin of a semiconductor device are described. A semiconductor device may include a plurality of mats, a plurality of sensing circuits, a plurality of connecting circuits, and a plurality of mat dividing circuits. The mats are divided into upper regions and lower regions and activated by word lines. The sensing circuits are arranged in regions among the plurality of mats and are configured to sense/amplify data applied from the plurality of mats. The connecting circuits are configured to control connections between the mats and the sensing circuits in correspondence to a plurality of bit line selection signals. The mat dividing circuits are configured to selectively connect bit lines of the upper regions and the lower regions to each other in correspondence to a plurality of mat selection signals.

18 Claims, 4 Drawing Sheets

SEMICONDUCTOR DEVICE WITH IMPROVED SENSE MARGIN OF SENSE AMPLIFIER

CROSS-REFERENCES TO RELATED APPLICATION

The present application claims priority under 35 U.S.C. §119(a) to Korean application number 10-2015-0117926, filed on Aug. 21, 2015, in the Korean Intellectual Property Office, which is incorporated herein by reference in its entirety.

BACKGROUND

1. Technical Field

Various embodiments generally relate to a semiconductor device, and more particularly, to technology for improving a sensing margin of a sense amplifier.

2. Related Art

A bit line sense amplifier of a semiconductor device may be classified as having an open bit line sense amplifier structure or a folded bit line sense amplifier structure. The operation characteristics of a bit line sense amplifier are associated with a ratio of bit line capacitance Cb to cell capacitance Cs, or Cb/Cs.

Semiconductor memory devices are highly integrated. Since cell capacitance Cs is reduced, the reduction of bit line capacitance Cb becomes increasingly important.

Accordingly, a DRAM for graphics that requires high speed operation employs a method for reducing the size of a cell mat to one half (½) in order to reduce the bit line capacitance Cb to one half (½). To this end, since the number of bit line sense amplifiers and sub-word line drivers should be increased twice, cell efficiency may be reduced.

To explain further, note that a semiconductor is fabricated from a silicon wafer. In order to maximize the number of semiconductor dies acquirable from one wafer, a critical design rule is to shrink a technology or an area of a chip through a change or the like in design architecture.

In one method of reducing the area of a chip, the size of a mat including a plurality of memory cells may be increased. When the mat size of a memory is increased, the number of sense amplifiers used between mats is reduced, so that it is possible to maximize the number of dies.

However, when the mat size of the memory is increased, the number of connected memory cells per unit bit line is increased. That is, the number of memory cells arranged in a cell mat of a unit memory is increased. Consequently, the number of cells per bit line connected to each sense amplifier is increased, so that it is possible to reduce the number of sense amplifiers.

However, the length of a bit line of a sense amplifier becomes long, resulting in an increase in the capacitance of the bit line. In such a case, since a sensing margin of the sense amplifier is reduced, it serves as a factor unfavorable to a high speed operation.

Accordingly, what are needed are semiconductor devices suitable for improving sensing margins in sense amplifiers, and/or other deficiencies of the prior art.

SUMMARY

Various embodiments of the present disclosure are directed to ensure a sensing margin and an operation speed of a sense amplifier, even when a mat size is increased.

In an embodiment of the present disclosure, a semiconductor device may include a plurality of mats, a plurality of sensing circuits, a plurality of connecting circuits, and a plurality of mat dividing circuits. The mats are divided into upper regions and lower regions and activated by word lines. The sensing circuits are arranged in regions among the plurality of mats and are configured to sense/amplify data applied from the plurality of mats. The connecting circuits are configured to control connections between the mats and the sensing circuits in correspondence to a plurality of bit line selection signals. The mat dividing circuits are configured to selectively connect bit lines of the upper regions and the lower regions to each other in correspondence to a plurality of mat selection signals.

According to an embodiment, the length of a bit line of a sense amplifier may be reduced to improve bit line loading. Even when the size of a mat is increased, it is possible to ensure a sensing margin and an operation speed of the sense amplifier.

DETAILED DESCRIPTION

Hereinafter, a semiconductor device will be described below with reference to the accompanying drawings through various examples of embodiments.

Figure 1:
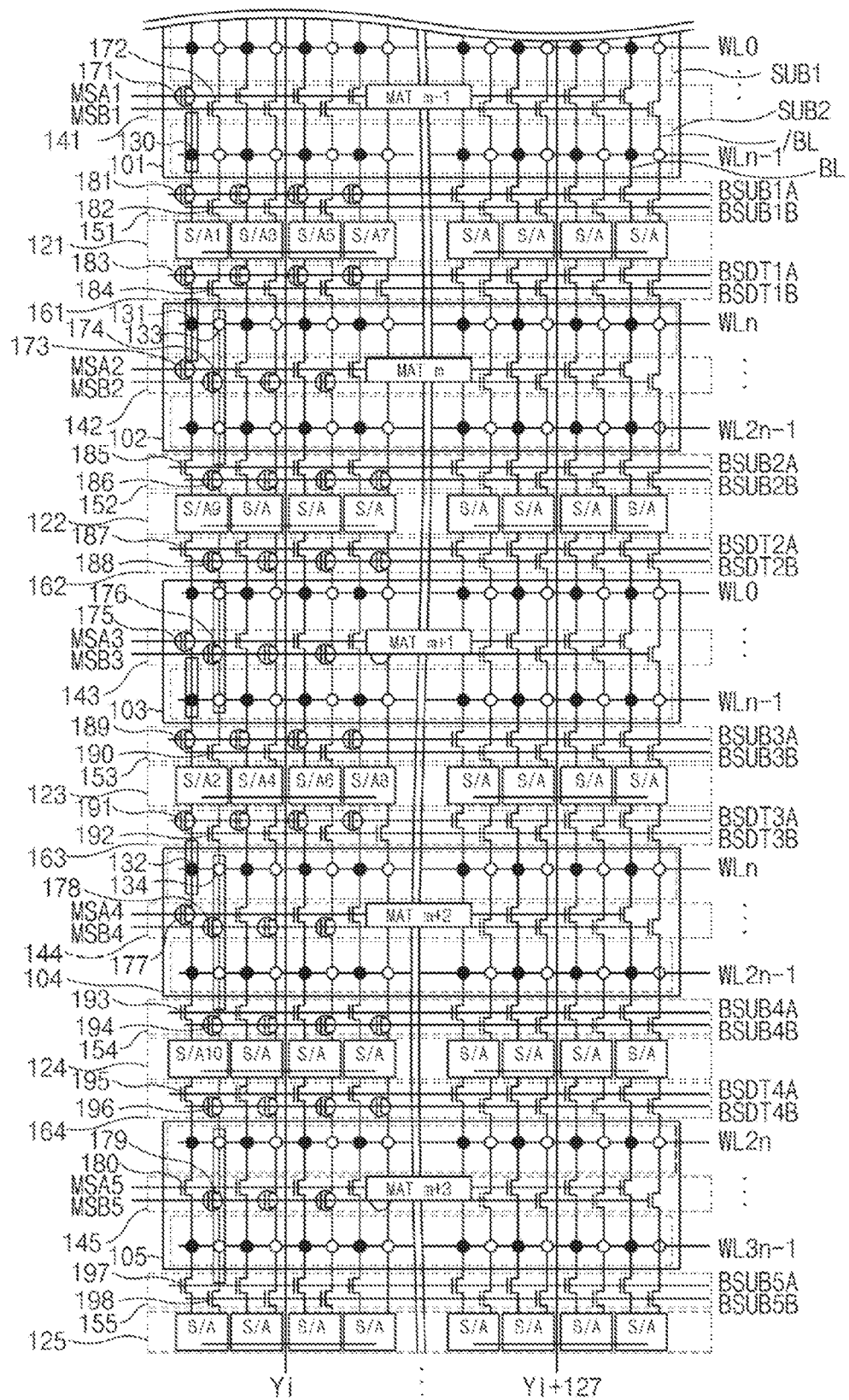
FIG. 1 is a circuit diagram of a semiconductor device according to an embodiment of the present disclosure.

FIG. 1 is a circuit diagram of a semiconductor device according to an embodiment of the present disclosure.

As shown in FIG. 1, a semiconductor device may include a plurality of mats 101 to 105, a plurality of sensing circuits 121 to 125, and a plurality of connecting circuits 151 to 155 and 161 to 164. The plurality of mats 101 to 105 may include a plurality of mat dividing circuits 141 to 145, respectively. Each of the plurality of sensing circuits 121 to 125 may include a plurality of sense amplifiers S/A.

The semiconductor device may be divided into a plurality of banks and is driven. Each of the plurality of banks may include the plurality of mats MAT 101 to 105 including a plurality of memory cells. That is, a memory cell array may be divided into a plurality of sets of the plurality of unit memory cell mats 101 to 105. These mats 101 to 105 may be arranged in a plural number in a row direction and a column direction to form a plurality of mat rows (mat blocks) and a plurality of mat columns.

For example, the respective mats 101 to 105 may be arranged in memory cell groups having various sizes of 512K, 640K, 768K, 832K, 1M, 1.2M and the like. The mat size of 512K represents that the number of word lines WL is 512 and the number of bit lines is 1024.

In 512K, the numeral of "512" and the like may represent the number of connected memory cells per bit line of a sense amplifier S/A. That is, when the mat size is 640K, it may represent that 640K memory cells may be connected per bit line. If redundant word lines for repair and the like are added, the sizes of the respective mats 101 to 105 may be increased by the number of redundant word lines.

Each of the plurality of mats 101 to 105 may be divided into an upper region SUB1 and a lower region SUB2 by each of the mat dividing circuits 141 to 145. The plurality of mat dividing circuits 141 to 145 may respectively divide the plurality of mats 101 to 105 into the upper regions SUB1 and the lower regions SUB2 by mat selection signals MSA1 to MSA5 and MSB1 to MSB5 (MSAi and MSBi). In the plurality of mats 101 to 105 in which the mat regions have been divided by the mat dividing circuits 141 to 145 in the vertical direction, row lines may be selected by word lines WL0, WLn−1, WLn, WL2n−1, WL2n, WL3n−1 . . . .

The mat dividing circuit 141 may include NMOS transistors 171 and 172. The NMOS transistors 171 and 172 may be connected between the upper region SUB1 and the lower region SUB2, and receive the mat selection signals MSA1 and MSB1 through gate terminals thereof. The mat dividing circuit 142 may include NMOS transistors 173 and 174. The NMOS transistors 173 and 174 may be connected between the upper region SUB1 and the lower region SUB2, and receive the mat selection signals MSA2 and MSB2 through gate terminals thereof. The mat dividing circuit 143 may include NMOS transistors 175 and 176. The NMOS transistors 175 and 176 may be connected between the upper region SUB1 and the lower region SUB2, and receive the mat selection signals MSA3 and MSB3 through gate terminals thereof. The mat dividing circuit 144 may include NMOS transistors 177 and 178. The NMOS transistors 177 and 178 may be connected between the upper region SUB1 and the lower region SUB2, and receive the mat selection signals MSA4 and MSB4 through gate terminals thereof. The mat dividing circuit 145 may include NMOS transistors 179 and 180. The NMOS transistors 179 and 180 may be connected between the upper region SUB1 and the lower region SUB2, and receive the mat selection signals MSA5 and MSB5 through gate terminals thereof. The mat dividing circuits 141 to 145 may selectively connect a bit line pair BL and/BL of the upper region SUB1 to a bit line pair BL and/BL of the lower region by the plurality of mat selection signals MSA1 to MSA5 and MSB1 to MSB5, respectively.

Among the plurality of NMOS transistors 171 to 180, the NMOS transistors 171, 173, 175, 177, and 179, which are switching elements of a first group, may be controlled by the mat selection signals MSA1 to MSA5. The NMOS transistors 172, 174, 176, 178, and 180, which are switching elements of a second group, may be controlled by the mat selection signals MSB1 to MSB5.

The mat 101 may include a memory cell 130 in a region in which the word lines WL0 and WLn−1 and the bit line BL cross each other. The mat 102 may include memory cells 131 and 133 in a region in which the word lines WLn and WL2n−1 and the bit line BL cross each other. The mat 104 may include memory cells 132 and 134 in a region in which the word lines WLn and WL2n−1 and the bit line BL cross each other. The plurality of memory cells 130 to 134 may be connected to the plurality of sensing circuits 121 to 125 through the bit line pair BL (Bit Line True) and/BL (Bit Line Bar).

In an embodiment, among the plurality of mats 101 to 105, two mats not adjacent to each other may be simultaneously activated by the word line WL. For example, when the word line WLn is enabled, the selected two memory cells 131 and 132 may be activated.

Furthermore, the sensing circuit 121 may be arranged in a region between the mats 101 and 102. The sensing circuit 122 may be arranged in a region between the mats 102 and 103, the sensing circuit 123 is arranged in a region between the mats 103 and 104. The sensing circuit 124 may be arranged in a region between the mats 104 and 105. Each of the plurality of sensing circuits 121 to 125 may be connected to a pair of bit lines BL and/BL.

The sense amplifiers S/A included in the plurality of sensing circuits 121 to 125 may be selectively connected to the memory cells 130 to 134 of the mats 101 to 105 through the plurality of connecting circuits 151 to 155 and 161 to 164. The sense amplifiers S/A may include a latch, a bit line equalization circuit, a bit line precharging circuit and the like.

The plurality of connecting circuits 151 to 155 and 161 to 164 may be included in regions between the respective mats 101 to 105 and the plurality of sensing circuits 121 to 125. The plurality of connecting circuits 151 to 155 and 161 to 164 may selectively control connections between the respective mats 101 to 105 and the plurality of sensing circuits 121 to 125 in correspondence to bit line selection signals BSUB1A to BSUB5A, BSUB1B to BSUB5B, BSDT1A to BSDT4A, and BSDT1B to BSDT4B.

Such connecting circuits 151 to 155 and 161 to 164 may include a plurality of NMOS transistors 181 to 198. The plurality of NMOS transistors 181 to 198 may be connected between the respective mats 101 to 105 and the plurality of sensing circuits 121 to 125. The plurality of NMOS transistors 181 to 198 may receive the bit line selection signals BSUB1A to BSUB5A, BSUB1B to BSUB5B, BSDT1A to BSDT4A, and BSDT1B to BSDT4B (BSUBiA, BSUBiB, BSDTiA, and BSDTiB (i= . . . , m−1, m, m+1, . . . )) through gate terminals thereof.

That is, the plurality of NMOS transistors 181, 182, 185, 186, 189, 190, 193, 194, 197, and 198, which are switching elements of a first group, may be arranged between the lower regions of the respective mats 101 to 105 and the upper regions of the plurality of sensing circuits 121 to 125. The plurality of NMOS transistors 183, 184, 187, 188, 191, 192, 195, and 196, which are switching elements of a second group, may be arranged between the upper regions of the respective mats 101 to 105 and the lower regions of the plurality of sensing circuits 121 to 125.

By the plurality of connecting circuits 151 to 155 and 161 to 164, the sensing circuits 121 to 125 may be connected to the bit line pair BL and/BL of the upper mat and may also be selectively connected to the bit line pair BL and/BL of the lower mat. That is, mats selected by the plurality of connecting circuits 151 to 155 and 161 to 164 may be selectively connected to the sensing circuits 121 to 125 of the upper region or the sensing circuits 121 to 125 of the lower region.

A burst length and the number of data (DQ) input/output lines may be changed according to the type and the structure of a semiconductor device. The number of column lines to be selected may be changed according to the burst length and the number of data input/output lines of the semiconductor device. Column selection signals YI may be activated in numbers different from one another by a column address input from an exterior. Consequently, at the time of a read/write command, data of a sense amplifier selected by the column selection signal YI among the sensing circuits of the selected mat 102 may be input and output.

Figure 2:
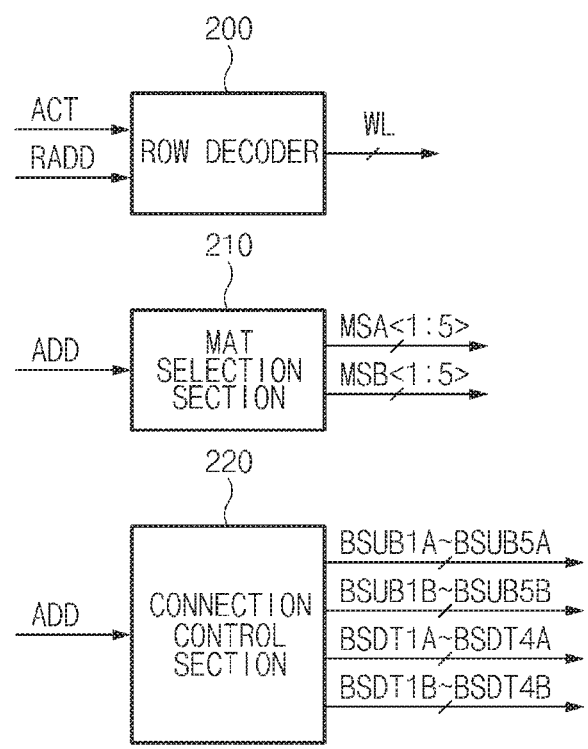
FIG. 2 is a configuration diagram of a controller for controlling each signal in a semiconductor device (e.g. the semiconductor device of FIG. 1)

FIG. 2 illustrates a configuration of a controller for controlling a semiconductor device, for example, a controller for controlling the semiconductor device of FIG. 1.

As shown in FIG. 2, the controller of a semiconductor device may include a row decoder 200, a mat selection section 210, and a connection control section 220.

The row decoder 200 may decode an active command ACT and row addresses RADD, and may selectively activate the word lines WL. In an embodiment, two word lines WL (for example, WLn) may be connected to two mats not adjacent to each other may be simultaneously activated in correspondence to the active command ACT and the row addresses RADD.

For example, it may be assumed that the row addresses RADD input to the row decoder 200 are A0 to A9. Among the row addresses A0 to A9, the row addresses A0 to A8 may be used as addresses for selectively activating the word lines WL in one mat MAT. The other row address A9 may be used as an address for selecting a mat. The logic level of the last row address A9 may be determined to simultaneously activate two word lines WL and to activate any one of the two word lines connected to the same mat.

The mat selection section 210 may selectively activate the mat selection signals MSA1 to MSA5 and the mat selection signals MSB1 to MSB5 in correspondence to an address ADD applied from an exterior. Furthermore, the connection control section 220 may selectively activate the bit line selection signals BSUB1A to BSUB5A, BSUB1B to BSUB5B, BSDT1A to BSDT4A, and BSDT1B to BSDT4B in correspondence to the address ADD applied from an exterior.

An operation process of a semiconductor device of the present disclosure, which may have the aforementioned configuration, or any other similar or suitable configuration, will now be described.

In a semiconductor device, two word lines WL may be enabled by the external active command ACT and row addresses RADD. For example, the word line Wn of the mat 102 and the word line WLn of the mat 103 may all enabled.

On the basis of the mats 102 and 104, the plurality of sensing circuits 121 to 124 arranged above and below the mat 102 operate, so that a read or write operation for the memory cells 131 to 134 of the mats 102 and 104 may be prepared.

For example, when the bit line selection signal BSUB1A is high, the bit line selection signals BSUB1B may be low, the bit line selection signals BSDT1A may be high, and the bit line selection signals BSDT1B may be low. Here, the transistors 181 and 183 of odd lines of the connecting circuits 151 and 161 may be turned on, and the transistors 182 and 184 of even lines of the connecting circuits 151 and 161 may be turned off. Accordingly, the respective sense amplifiers S/A1, S/A3, S/A5, S/A7 . . . included in the sensing circuit 121 may be connected to the bit lines BL of the mat 101 and the mat 102 by the connecting circuits 151 and 161.

Furthermore, when the bit line selection signal BSUB2A is low, the bit line selection signals BSUB2B may be high, the bit line selection signals BSDT2A may be low, and the bit line selection signals BSDT2B may be high. Here, the transistors 186 and 188 of even lines of the connecting circuits 152 and 162 may be turned on and the transistors 185 and 187 of odd lines of the connecting circuits 152 and 162 may be turned off. Accordingly, the respective sense amplifiers S/A . . . included in the sensing circuit 122 may be connected to the bit lines BL of the mat 102 and the mat 103 by the connecting circuits 152 and 162.

Furthermore, when the bit line selection signal BSUB3A is high, the bit line selection signals BSUB3B may be low, the bit line selection signals BSDT3A may be high, and the bit line selection signals BSDT3B may be low, the transistors 189 and 191 of odd lines of the connecting circuits 153 and 163 may be turned on and the transistors 190 and 192 of even lines of the connecting circuits 153 and 163 may be turned off. Accordingly, the respective sense amplifiers S/A2, S/A4, S/A6, S/A8 . . . included in the sensing circuit 123 may be connected to the bit lines BL of the mat 103 and the mat 104 by the connecting circuits 153 and 163.

Furthermore, when the bit line selection signal BSUB4A is low, the bit line selection signals BSUB4B may be high, the bit line selection signals BSDT4A may be low, and the bit line selection signals BSDT4B may be high, the transistors 194 and 196 of even lines of the connecting circuits 154 and 164 may be turned on and the transistors 193 and 195 of odd lines of the connecting circuits 154 and 164 may be turned off. Accordingly, the respective sense amplifiers S/A . . . included in the sensing circuit 124 may be connected to the bit lines BL of the mat 104 and the mat 105 by the connecting circuits 154 and 164.

Furthermore, when the active command ACT is activated, each upper region SUB1 and each low region SUB2 of the mats 102, 104, 103, and 105, in which the word lines WL have been activated, may be selectively connected to a plurality of bit lines BL. That is, the mat selection signals MSA2, MSA3, MSA4, and MSA5 may have a low level and the mat selection signals MSB2, MSB3, MSB4, and MSB5 may have a high level. Accordingly, the NMOS transistors 174, 176, 178, and 180 of the mat dividing circuits 142, 143, 144, and 145 may be turned on. Then, in the mats 102, 104, 103, and 105, each upper region SUB1 and each low region SUB2 may be connected to each other.

In an active operation, the mat selection signals MSAi and MSBi of the mats 102, 104, 103, and 105 operated by a selected WL may be complementarily activated. The bit line selection signal BSUBiA and the bit line selection signal BSUBiB, which selectively connect the sensing circuits 121 to 125 to the bit line BL, may be complementarily activated. The bit line selection signal BSDTiA and the bit line selection signal BSDTiB may complementarily operate.

For example, when the mats 102 and 104 are selected by the external active command ACT and the word line WL is enabled, the mat selection signal MSA2 may have a low level, the bit line selection signals BSUB1A and BSDT1A of the sense amplifier S/A1 of the sensing circuit 121 may have a high level, and the bit line selection signals BSUB1B and BSDT1B may have a low level. All the mat selection signals MSA1 and MSB1 of the mat 101 may have a low level.

Accordingly, the memory cell 131 of the mat 102 may be connected to the true bit line BL of the sense amplifier S/A1 of the sensing circuit 121 through the bit line BL of the upper region SUB1 of the mat 102 and the NMOS transistor 183.

Furthermore, the bar bit line/BL of the sense amplifier S/A may be connected to the bit line BL of the lower region SUB2 of the mat 101 and the NMOS transistor 181. At this time, since the mat selection signal MSA1 may have a low level, it is not connected to the bit line BL of the upper region SUB1 of the mat 101.

Therefore, while the data of the memory cell 131 of the mat 102 is being sensed and amplified, the true bit line BL of the sense amplifier S/A1 may be connected to the upper region SUB1 (one bit line BL) of the mat 102. The bar bit line/BL may be connected to the lower region SUB2 (one bit line/BL) of the mat 101 to operate as a reference of the sense amplifier S/A1.

In the mat 102, the NMOS transistor 174 is turned on, so that the upper region SUB1 and the lower region SUB2 of the mat 102 may be connected to each other. Accordingly, the memory cell 133 of the mat 102 may be connected to the bar bit line/BL of the sense amplifier S/A9 of the sensing circuit 122. Furthermore, the true bit line BL of the sense amplifier S/A9 may be connected to the bit line BL of the upper region SUB1 and the lower region SUB2 of the mat 103 through the NMOS transistor 188 and the NMOS transistor 176.

That is, on the basis of the sense amplifier S/A9, the bar bit line/BL may be connected to the bit line BL of the upper region SUB1 and the lower region SUB2 of the mat 102. Thus, the data of the memory cell 133 may be sensed and amplified. Furthermore, the true bit line BL of the sense amplifier S/A9 may be connected to the bit line BL of the upper region SUB1 and the lower region SUB2 of the mat 103 to operate as a reference.

In the same manner, the memory cell 132 of the mat 104 may operate similarly to the memory cell 131. That is, in the memory cell 132, the lower region SUB2 of the mat 103 and the upper region SUB1 of the mat 104 may be connected to one bit line through the sense amplifier S/A2, so that the memory cell 132 operates loading.

The memory cell 134 may operate similarly to the memory cell 133. That is, the memory cell 134 may perform a sensing operation with bit line BL loading of the upper region SUB1 and the lower region SUB2 of the mat 104, and the upper region SUB1 and the lower region SUB2 of the mat 105, through the sense amplifier S/A.

In a general case, in an active operation, one word line WL may be activated in the mat 102 selected by an external address. Furthermore, among memory cells connected to the word lines WL activated in the selected mat 102, data of all memory cells (for example, eight) may be connected to a selected column selection signal Yi is used as input/output data in a read/write operation.

However, in an embodiment of the present disclosure, among memory cells connected to the word lines WLm activated in the selected two mats 102 and 104, only data of half memory cells connected to a selected column selection signal Yi may be used as input/output data in a read/write operation.

For example, in an embodiment of the present disclosure, the word lines WLn may be activated in the two mats 102 and 104, so that the number of input/output data of memory cells connected to a selected column may total 16. Among them, only eight memory cells corresponding to ½ may be used in a data input/output operation through the sense amplifier S/A. The other eight memory cells may perform an operation for restoring data of memory cells through the sensing circuits 122 and 124.

According to an embodiment, in memory cells enabled by the selected mat 102 and the word line WLn, the bit line BL loading of a sensing circuit required in a read/write operation may be reduced, so that it is possible to perform a sensing operation at a high speed (tRCD improvement).

In the case of a memory cell that performs only a restoring operation, since it does not participate in the read/write operation, high speed operation is not required. Accordingly, the sense amplifiers S/A of the sensing circuits 122 and 124 may be allowed to be enabled after a sufficient time period as compared with the sensing circuits 121 and 123 required in the read/write operation.

A voltage difference between the true bit line BL and the bar bit line/BL in an initial operation of a sense amplifier may be defined as $\Delta V$, and this value is an important factor in a sensing margin of a bit line sense amplifier. The voltage difference $\Delta V$ of the sense amplifier may be expressed by an approximate Equation such as $\pm 0.5 VCORE/(1+Cb/Cs)$.

The core voltage VCORE is a voltage of the true bit line BL or the bar bit line/BL, Cb denotes bit line capacitance, and Cs denotes capacitance of a memory cell. Cb may be affected by capacitance per unit area of the bit line BL, the length of the bit line, or a mat size of a memory, and when voltage difference $\Delta V$ increases, the sensing margin of the sense amplifier increases.

Figure 3:
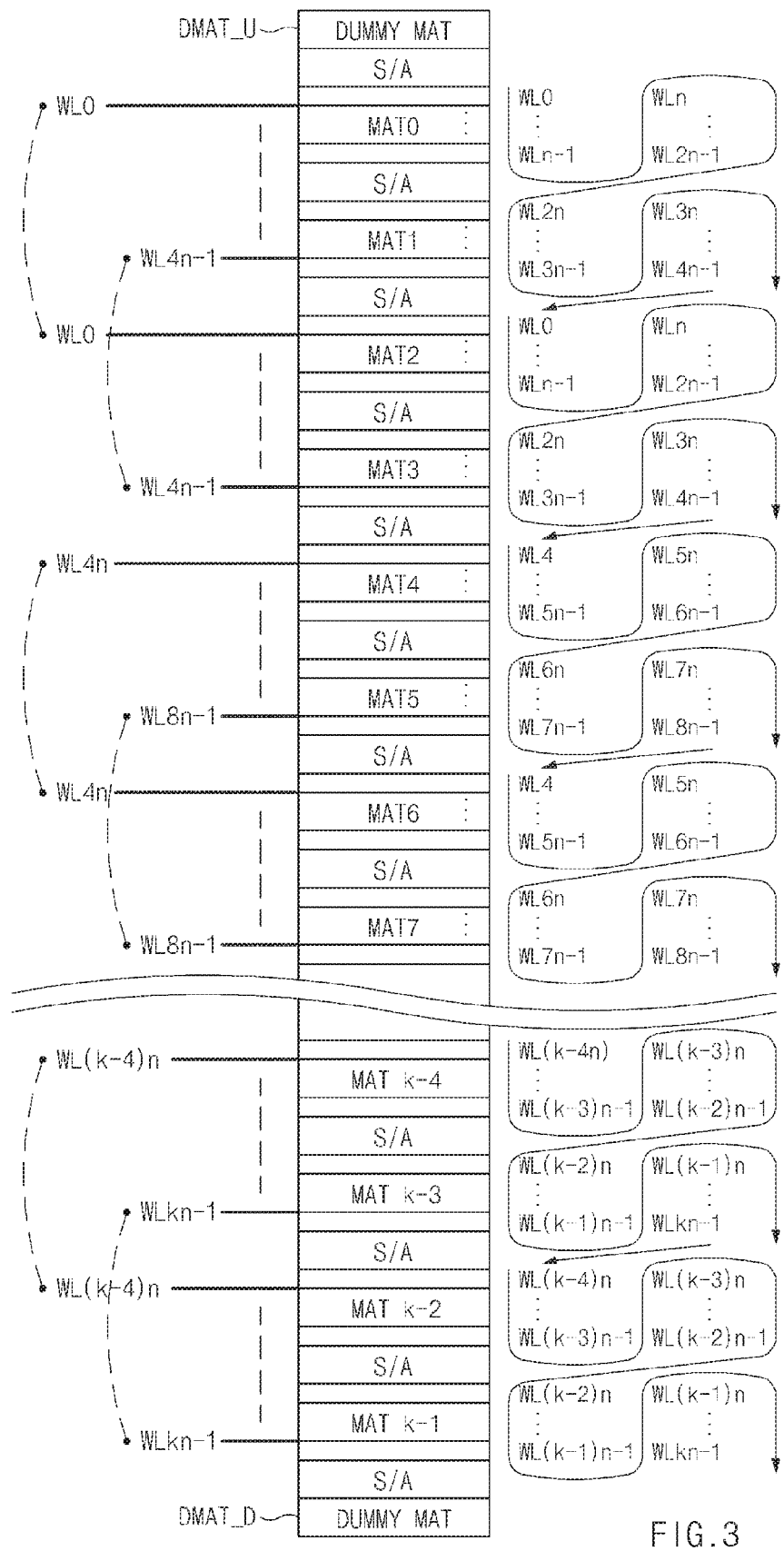
FIG. 3 is a configuration diagram of a semiconductor device according to an embodiment of the present disclosure.

FIG. 3 is a configuration diagram of a semiconductor device according to an embodiment of the present disclosure.

The semiconductor device may include dummy mats DMAT_U and DMAT_D in upper and lower edge regions of normal mats MAT0 to MATk−1. The dummy mat DMAT_U may be formed above the normal mat MAT0, and the dummy mat DMAT_D may be formed below the normal mat MATk−1.

Each of the dummy mats DMAT_U and DMAT_D may be connected to one sense amplifier S/A and a pair of bit lines. In a sensing operation of the normal mats MAT0 to MATk−1, the pair of bit lines may be connected to each of the dummy mats DMAT_U and DMAT_D may be used as a reference. The structures of each of the normal mats MAT0 to MATk−1 and the sense amplifier S/A may be equal to that of the embodiment of FIG. 1.

According to an embodiment, in an active operation, two word lines WL may be activated, so that two mats MAT not adjacent to each other may be simultaneously activated.

For example, when the word line WL0 of the normal mats MAT0 and MAT2 is activated, the word lines WLkn−1 of the normal mats MATk−3 and MATk−1 may be simultaneously activated. In the embodiment of FIG. 3, the arrangement of each word line WL may be set by the row decoder 200 illustrated in FIG. 2.

The row decoder 200 may set an arrangement order of the word lines WL connected to each mat by the row addresses RADD as illustrated in FIG. 3. The directions of arrows in FIG. 3 indicate an order in which respective word lines are activated.

For example, in the arrangement order of the word lines WL, WL0 to WLn−1, WLn to WL2n−1, WL2n to WL3n−1, and WL3n to WL4n−1 may be sequentially selected. Accordingly, the normal mats may be sequentially activated in sequence of MAT0/MAT2, MAT1/MAT3 . . . MATk−3/MATk−1.

That is, when two word lines WL0 are enabled, the normal mats MAT0 and MAT2 may be simultaneously activated. Further, when two word lines WL4n−1 are enabled, the normal mats MAT1 and MAT3 may be simultaneously activated. After subsequent word lines are sequentially activated, when the last two word lines WLkn−1 are enabled, the normal mats MATk−3 and MATk−1 may be simultaneously activated.

The word line WL connected to the mat MAT0 may be connected to WL0 and WLn. The row decoder 200 may determine the logic level of the last row address A12 described above, that is, the coding signal, and activate one of the two word lines WL0 and WLn connected to the same mat MAT0.

For example, when the logic level of the row address A9, which is the coding signal, is at a low level, the word line WL0 arranged at the left column of the two word lines WL0 and WLn connected to the mat MAT0 may be selected. However, when the logic level of the row address A9, which is the coding signal, is at a high level, the word line WLn arranged at the right column of the two word lines WL0 and WLn may be selected.

Figure 4:
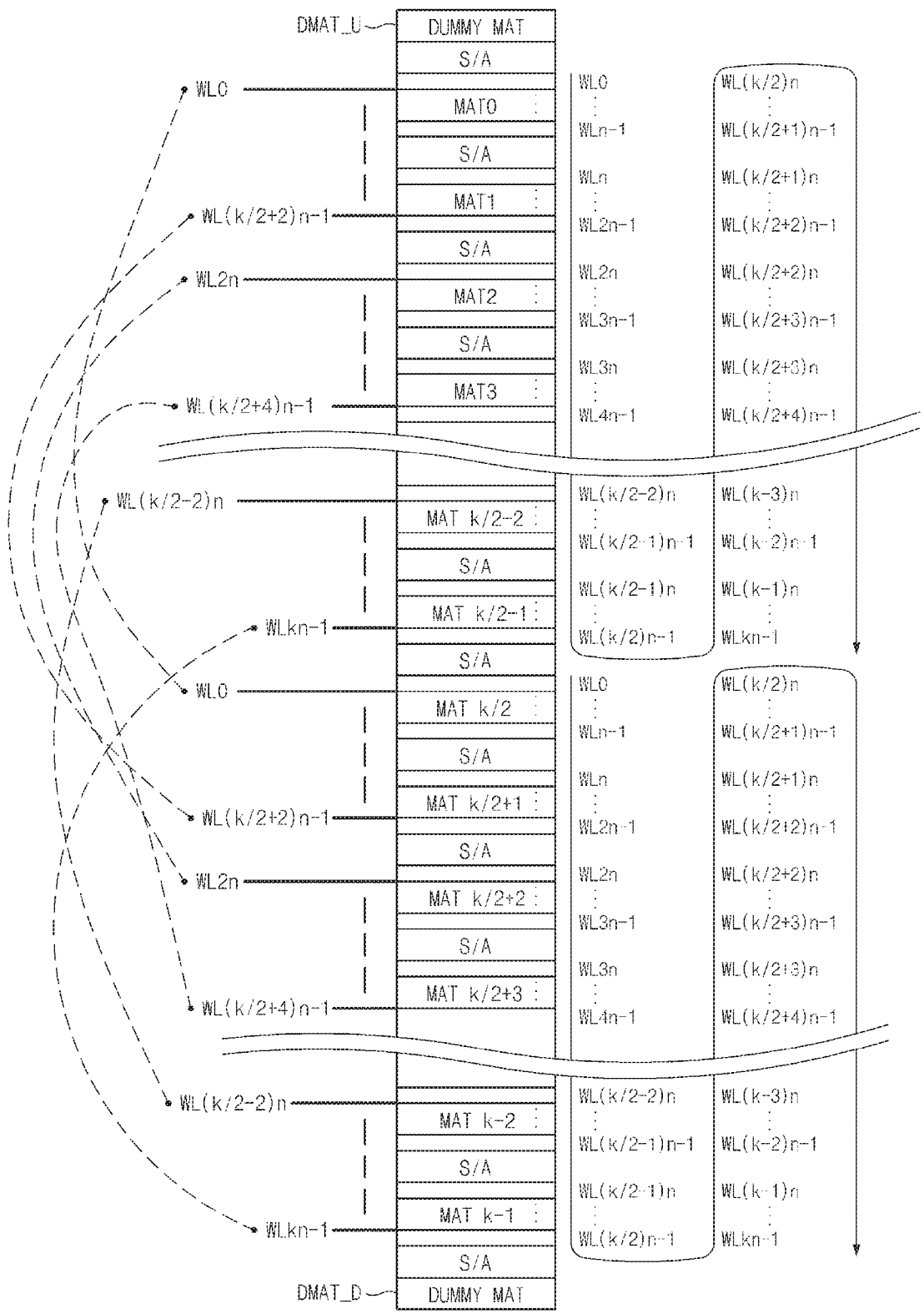
FIG. 4 is a configuration diagram of a semiconductor device according to an embodiment of the present disclosure.

FIG. 4 is a configuration diagram of a semiconductor device according to an embodiment of the present disclosure.

The semiconductor device of FIG. 4 may have a word line arrangement scheme different from that of FIG. 3.

For example, when the word line WL0 of normal mats MAT0 and MATk/2 is activated, the word lines WL2n of normal mats MAT2 and MATk/2+2 may be simultaneously activated. In the embodiment of FIG. 4, the arrangement of each word line WL may be set by the row decoder 200 illustrated in FIG. 2.

The row decoder 200 may set an arrangement order of the word lines WL connected to each mat by the row addresses RADD as illustrated in FIG. 4. The directions of arrows in FIG. 4 indicate an order in which respective word lines are activated.

For example, in the arrangement order of the word lines WL, WL0 to WLn−1, WLn to WL2n−1, WL2n to WL3n−1, WL3n to WL4n−1, WL(k/2−2)n to WL(k/2−1)n−1, and WL(k/2−1)n to WL(k/2)n−1 may be sequentially selected. Furthermore, WL(k/2)n to WL(k/2+1)n−1, WL(k/2+1)n to WL(k/2−2)n−1, WL(k/2+2)n to WL(k/2+3)n−1, WL(k/2+3)n to WL(k/2+4)n−1, WL(k−3)n to WL(k−2)n−1, and WL(k−1)n to WLkn−1 may be sequentially selected.

Accordingly, the normal mats may be sequentially activated in sequence of MAT0, MATk/2 . . . MAT1, MATk/2+1 . . . MATk/MAT2−1, MATk−1.

That is, in the case in which the total number of mats MAT is K except for the dummy mats DMAT_U and DMAT_D, when two word lines WL0 are enabled, the normal mats MAT0 and MATk/2 may be simultaneously activated. When two word lines WL2n are enabled, the normal mats MAT2 and MATk/2+2 may be simultaneously activated.

Then, when two word lines WL(k/2+2)n−1 are enabled, the normal mats MAT1 and MATk/2+1 may be simultaneously activated. After subsequent word lines are sequentially activated, when the last word lines WLkn−1 are enabled, the normal mats MATk/2−1 and MATk−1 may be simultaneously activated.

The word line WL connected to the mat MAT0 may be connected to word lines WL0 and WL(k/2)n. The row decoder 200 may determine the logic level of the last row address A12 described above, that is, the coding signal. The row decoder 200 may activate one of the two word lines WL0 and WL(k/2)n connected to the same mat MAT0.

For example, when the logic level of the row address A9, which is the coding signal, is at a low level, the word line WL0 arranged at the left column of the two word lines WL0 and WL(k/2)n connected to the mat MAT0 may be selected. However, when the logic level of the row address A9, which is the coding signal, is at a high level, the word line WLn arranged at the right column of the two word lines WL0 and WL(k/2)n may be selected.

As described above, in the embodiment of the present disclosure, the word lines WL may be activated in mats MAT not adjacent to each other. An increase order of the row addresses RADD may be used by dividing the entire mat MAT into 2, 4, 8 equal parts and the like.

While various embodiments have been described above, it will be understood to those skilled in the art that the embodiments described are by way of example only. Accordingly, the semiconductor device described herein should not be limited based on the described embodiments.

What is claimed is:

1. A semiconductor device, comprising:
a plurality of mats divided into upper regions and lower regions and activated by word lines;
a plurality of sensing circuits arranged in regions among the plurality of mats, and configured to sense or amplify data applied from the plurality of mats;
a plurality of connecting circuits configured to control connections between the plurality of mats and the plurality of sensing circuits in correspondence to a plurality of bit line selection signals;
a plurality of mat dividing circuits configured to selectively connect bit lines of the upper regions and the lower regions to each other in correspondence to a plurality of mat selection signals; and
a connection control section configured to selectively activate the plurality of bit line selection signals in correspondence to an address applied to an exterior,
wherein each of the plurality of sensing circuits is selectively connected to the lower region located above a sense amplifier selected by control of the plurality of connecting circuits and the upper region located below the sense amplifier.

2. The semiconductor device of claim 1, wherein each of the plurality of sensing circuits includes a plurality of sense amplifiers and one bit line pair connected to one sense amplifier.

3. The semiconductor device of claim 1, wherein each of the plurality of connecting circuits is formed in a region between the plurality of mats and the plurality of sensing circuits.

4. The semiconductor device of claim 3, wherein each of the plurality of connecting circuits includes a plurality of transistors connected between the plurality of mats and the plurality of sensing circuits and receiving the plurality of bit line selection signals through gate terminals thereof.

5. The semiconductor device of claim 4, wherein in each of the plurality of connecting circuits, a pair of transistors are connected to one sense amplifier, and complementarily operate in correspondence to the plurality of bit line selection signals.

6. The semiconductor device of claim 4, wherein each of the plurality of connecting circuits comprises:
switching elements of a first group arranged between lower portions of plurality of mats and upper portions of the plurality of sensing circuits; and
switching elements of a second group arranged between upper portions of plurality of mats and lower portions of the plurality of sensing circuits.

7. The semiconductor device of claim 1, wherein each of the plurality of mat dividing circuits includes a plurality of transistors connected between the upper regions and the lower regions and receiving the plurality of mat selection signals through gate terminals thereof.

8. The semiconductor device of claim 7, wherein each of the plurality of mat dividing circuits comprises:
switching elements of a first group controlled by a first mat selection signal; and
switching elements of a second group controlled by a second mat selection signal,
wherein the first mat selection signal and the second mat selection signal are complementarily activated.

9. The semiconductor device of claim 1, wherein in the plurality of mats, in an active operation, two word lines are activated, so that two mats not adjacent to each other are simultaneously activated.

10. The semiconductor device of claim 1, wherein in the plurality of mats, when a column selection signal is activated, data is read/written only in memory cells corresponding to ½ of memory cells of a mat selected by a word line, and remaining half memory cells perform a restoring operation.

11. The semiconductor device of claim 1, wherein in the plurality of mats, word lines of each mat are activated at a specific mat interval.

12. The semiconductor device of claim 1, further comprising:
a row decoder configured to activate the word lines by a number of specific units in correspondence to an active command and row addresses.

13. The semiconductor device of claim 12, wherein the row decoder selects any one of word lines of specific units for activating a same mat in correspondence to a logic level of any one set in advance of the row addresses.

14. The semiconductor device of claim 1, further comprising:
a mat selection section configured to selectively activate the plurality of mat selection signals in correspondence to an address applied to an exterior.

15. The semiconductor device of claim 1, further comprising:
a first dummy mat formed in an upper edge region of the plurality of mats; and
a second dummy mat formed in a lower edge region of the plurality of mats.

16. The semiconductor device of claim 15, further comprising:
a sensing circuit formed between the first dummy mat and a mat arranged at an uppermost position of the plurality of mats; and
a connecting circuit configured to selectively control a connection between the sensing circuit and the first dummy mat.

17. The semiconductor device of claim 15, further comprising:
a sensing circuit between the second dummy mat and a mat arranged at a lowermost position of the plurality of mats; and
a connecting circuit configured to selectively control a connection between the sensing circuit and the second dummy mat.

18. The semiconductor device of claim 1, wherein in each of the plurality of sensing circuits, one bit line connected to a first mat of a pair of bit lines is used to read or write memory cell data, and a remaining bit line connected to a second mat is used as a reference.

* * * * *